United States Patent [19]

Sohn et al.

[11] Patent Number: 5,428,247
[45] Date of Patent: Jun. 27, 1995

[54] DOWN-BONDED LEAD-ON-CHIP TYPE SEMICONDUCTOR DEVICE

[75] Inventors: Hai-jeong Sohn, Suwon; Young-hee Song, Seoul, both of Rep. of Korea

[73] Assignee: Samsung Electronics Co., Ltd., Kyungki-do, Rep. of Korea

[21] Appl. No.: 165,021

[22] Filed: Dec. 10, 1993

[30] Foreign Application Priority Data

Dec. 17, 1992 [KR] Rep. of Korea ............ 92-24620

[51] Int. Cl.6 .............. H01L 23/48; H01L 29/40; H01L 23/02; H01L 23/12
[52] U.S. Cl. .................. 257/676; 257/668; 257/664; 257/666; 257/691
[58] Field of Search ............ 257/668, 691, 664, 784, 257/676

[56] References Cited

U.S. PATENT DOCUMENTS

| 4,567,643 | 2/1986 | Droguet et al. | 257/777 |
| 5,175,397 | 12/1992 | Lindberg | 257/668 |
| 5,208,188 | 5/1993 | Newman | 257/668 |
| 5,220,195 | 6/1993 | McShane et al. | 257/691 |
| 5,252,854 | 10/1993 | Arita et al. | 257/691 |

FOREIGN PATENT DOCUMENTS 58-220454 12/1983 Japan ................. 257/668

Primary Examiner—William D. Larkins
Assistant Examiner—Teresa M. Arroyo
Attorney, Agent, or Firm—Robert A. Westerlund; Stephen R. Whitt; Charles R. Donohoe

[57] ABSTRACT

Disclosed is a semiconductor device wherein the down bonding and the mounting of multi-pin is made possible. A conductive member adhered to the bottom surface of the semiconductor element. The conductive member and the specific pad of the semiconductor element are connected by the connecting member, which enables the entire bottom surface of the semiconductor element to be used for down bonding. Further, the more effective latch-up suppression, noise dispersion and speed improvement compared with the conventional LOC-type package structure is possible.

8 Claims, 6 Drawing Sheets

DOWN-BONDED LEAD-ON-CHIP TYPE SEMICONDUCTOR DEVICE

BACKGROUND OF THE INVENTION

The present invention relates to a semiconductor device, and more particularly to a semiconductor device which enables a down bonding and a mounting of a multi-pin in :semiconductor package.

The lead-on-chip (LOC) technique is introduced so as to make a large chip to be easily loaded in the standard package, for the semiconductor element, especially for a RAM-structured memory chip. And the strengthening of the chip characteristic was possible owing to the LOC technique.

Additionally, in a semiconductor memory device, method of down bonding the Vss or Vcc terminal is used for suppressing a latch-up so as to keep the characteristics of an element against the change of the external voltage for dynamic random access memory (DRAM). This method is also used for noise dispersion and speed enhancement for static random access memory (SRAM). The down bonding method means that the semiconductor element is connected with the pattern terminal for use in bonding formed on a top surface of the element, having the active surface of the element as a bottom surface thereof.

A bus-bar or conductive film is bonded in order to perform the down bonding in the LOC or chip-on-lead (COL) type semiconductor package wherein the chip attach pad is not provided. However, the mounting of multi-pin for this case is difficult.

The down bonding method of the conventional semiconductor package by referring to FIG. 1 to FIG. 6 is explained as follows:

First, FIGS. 1 and 2 acre the embodiments of the conventional bonding method, and illustrate the down bonding method for plastic package when the lead frame wherein the die attach pad is provided is used. FIG. 1 shows the case when the tie bar connected to die pad is down-bonded, while FIG. 2 shows the case when the wing-tip of die pad is down-bonded.

Referring to FIG. 1 and FIG. 2, when the sawing process wherein a multiple of chips formed on semiconductor wafer are sawed into separate chips and the quality chips are selected among the above separated chips is finished, the above quality chips 1 are detached from wafer. Then, the detached chips are attached on a die pad 8, and the wire bonding wherein bonding pads 2 and 3 of chip 1 are connected as shown in 5 and 5' to leads 4 and 4' is performed. At this time, the down bonding which supports a specific pad among the bonding pads of chip 1 is performed, and a tie bar 6 which supports die pad 8 is down-bonded 7 in FIG. 1, while a wing-tip 9, i.e., a protrusion of die pad 8 is down-bonded in FIG. 2.

FIG. 3 and FIG. 4 are the sectional views of FIG. 1 and FIG. 2, respectively.

As shown in FIG. 3 and FIG. 4, chip 1 separated from the semiconductor wafer is attached on die pad 8 whereon a conductive adhesive 10 is deposited. Then, a down bonding 7 is performed to tie bar 6 which supports die pad 8 or to wing-tip 9.

FIG. 5 and FIG. 6 show the embodiments of the bonding method of the conventional LOC type-package, and explain the down bonding method for the case of using the lead frame wherein the chip attach pad is not provided. FIG. 5 shows the case when the conductive film is used, while FIG. 6 shows the case when the bus-bar is used.

Referring to FIG. 5 and FIG. 6, the wire bonding which connects (15 and 15') a bonding pad 17 of the chip and leads 19 and 19' on each individual chip 11 separated from the semiconductor wafer is performed after the sawing process is completed. At this time, down bonding which supports the specific pad among the bonding pads of the chip is performed, and down bondings 12, 12', 13 and 14 are performed for a conductive film 16 on chip 11 in FIG. 5, while down bondings 12, 14, 15 and 15' are performed for Vcc or Vss bus-bars 20 and 21 in FIG. 6. The reference numerals 16', 17' and 18 which are not explained in FIGS. 5 and 6 indicate an insulating tape, a bus-bar bonding pad and a Vcc or Vss lead, respectively.

Size of the conductive film and bus-bar region cannot be sufficiently expanded, when the down bonding is performed for the above conventional LOC-type package, and accordingly, the mounting of multi-pin is difficult.

SUMMARY OF THE INVENTION

It is an object of the present invention to provide a semiconductor device wherein the characteristics of an element is strengthened and the mounting of a multi-pin is made easy due to the conductive film attached to entire bottom surface of a chip.

To accomplish the above object, there is provided a semiconductor device comprising a semiconductor element; a lead-on-chip-type lead group For use as an electrical connection between the semiconductor element and an external circuit; a member which connects electrically between each lead of the lead group and each corresponding bonding pad placed on the top surface of the semiconductor element, and consists of encapsulating the semiconductor element, connecting member and the part of each lead using a resin, wherein the semiconductor device comprises a conductive member attached to the bottom surface of the semiconductor element to be electrically transmitted, and extended outside one side of the semiconductor element in which the leads are not placed, and wherein the extended part of the conductive member and the corresponding bonding pad on the top surface of the semiconductor element are down-bonded using the same member as that of the connecting member.

In addition to this, there is provided a semiconductor device comprising a semiconductor element wherein a plurality of bonding pads disposed on the center of the top surface in the lengthwise direction are provided; a pair of insulating tape attached to the left and right of the bonding pads on the top surface of the semiconductor element and extended in the lengthwise direction; a pair of lead group wherein a plurality of leads whose one end is electrically connected to the external circuit and the other end is extended to the top surface of the insulating tape in the direction of crossing the insulating tape and is electrically connected to the semiconductor element, are arranged in parallel by a predetermined spacing; a pair of power bus-bar which ranges partially on the insulating rope between the pair of lead group and the bonding pads at least, and extends lengthwise, having an both end parts horizontal to the leads; a conductive member attached to the bottom surface of the semiconductor element and extends from one side of the semiconductor element wherein the lead group is not provided to outside, and at least one part of the extended portion has a conductive layer for down bonding; and a connecting member which electrically connects the pair of lead group, the pair of power bus-bar, and the conductive member with each corresponding bonding pads.

Further, there is provided a semiconductor device comprising a semiconductor element wherein a central bonding pad line arranged in the lengthwise direction by a first predetermined spacing is provided on the center of the top surface, and a pair of edge bonding pad line arranged in the lengthwise direction by a second predetermined spacing is provided in the right and left edges of the top surface; a pair of insulating tape attached between the central bonding pad line and each edge bonding pad line on the top surface of the semiconductor element, and extended lengthwise; a pair of first lead group wherein a plurality of leads whose one end is electrically connected to an external circuit and the other end comes close to the edge bonding pad from the outside of one side of the semiconductor element and is electrically connected to each edge bonding pad of the semiconductor element, are arranged parallel in a third predetermined spacing; a pair of second lead group wherein a plurality of leads whose one end is electrically connected to the external circuit and the other end is extended to the insulating tape and is electrically connected to the each center bonding pads, are placed between each lead of the first lead group; a conductive member attached to the bottom surface of the semiconductor element and extended from one side of the semiconductor element wherein the first and second lead group is not placed to outside, and at least one part of the extended portion has a conductive layer for down bonding; and a connecting member which electrically connects the pair of first and second lead group, and the conductive member with each corresponding bonding pad.

According to a preferred embodiment of the present invention, the conductive member comprises an adhesive tape whose width is larger than that of the bottom surface of the semiconductor element and a conductive layer extended lengthwise along the center of the top surface of the adhesive tape, and a conductive polyimide adhesive tape is used as the adhesive tape.

Additionally, the conductive member can comprise a conductive adhesive tape whose width is larger than that of the bottom surface of the semiconductor element and a conductive layer which is formed on the part of the top surface of the conductive adhesive tape extended outside one side of the semiconductor element, whereto the connecting member is attached.

The present invention enables a down bonding in LOC-type package since the present invention uses the structure wherein a conductive member adhered to the bottom surface of a chip, which then is connected to the specific pad of a semiconductor element by a connecting member.

Further, the mounting density of the semiconductor package is increased since the present invention uses the structure wherein the multi-pin are arranged having minimized the lead spacing on the chip.

Accordingly, the present invention enables better suppression of a latch-up, noise dispersion and speed improvement as compared with the conventional LOC-type package.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE INVENTION

The present invention will be described below in more detail with reference to the attached drawings.

Figure 1:
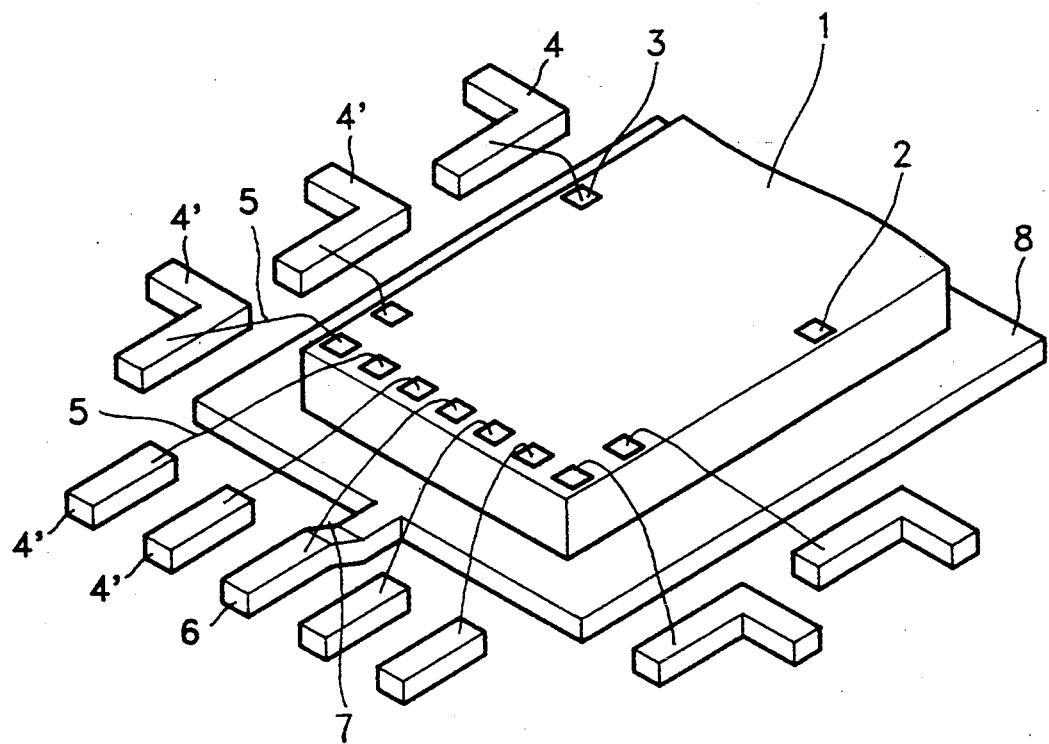
FIGS. 1 and 2 show the embodiment of the bonding method of the conventional semiconductor device.
Figure 2:
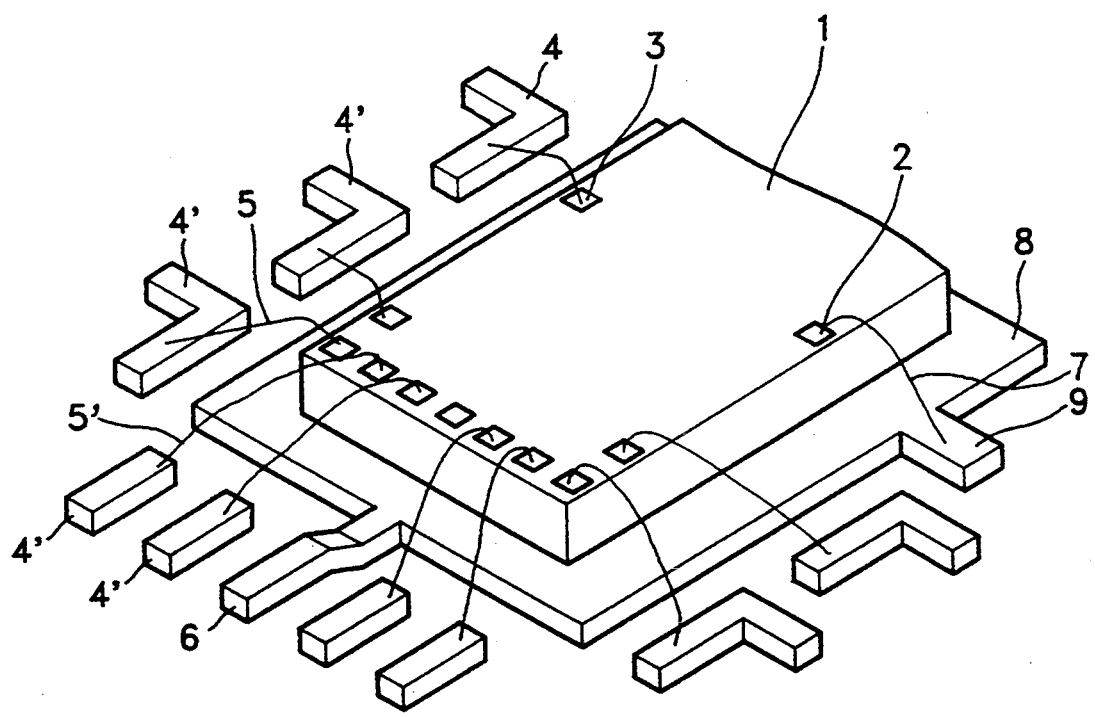
Figure 3:
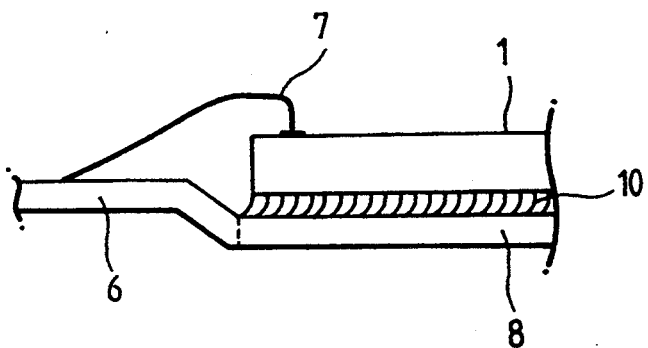
FIGS. 3 and 4 are the sectional views of FIGS. 1 and 2 respectively.
Figure 4:
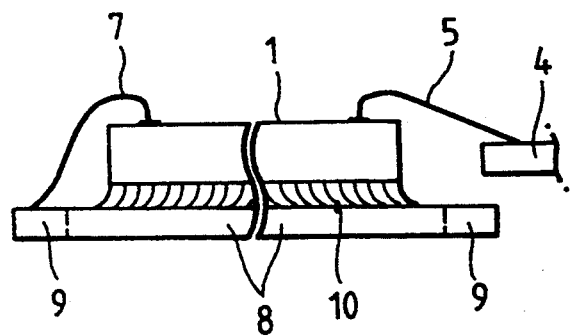
Figure 5:
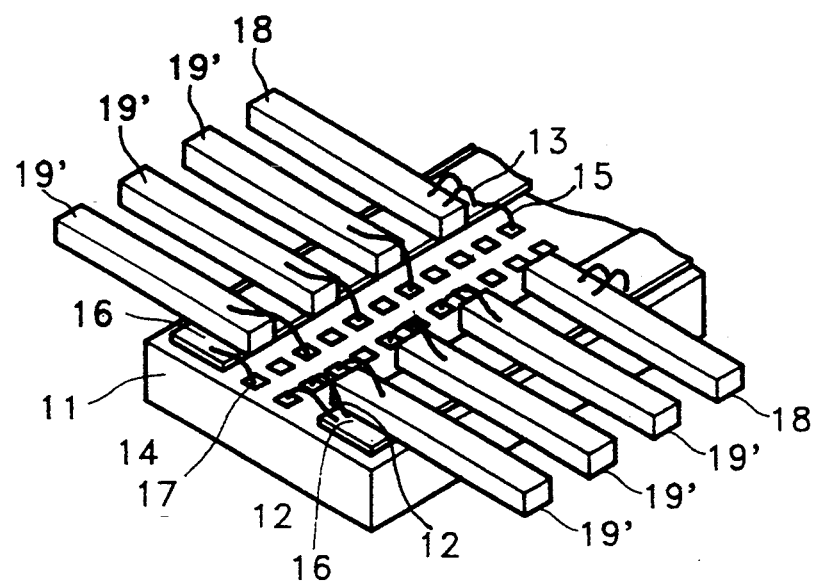
FIGS. 5 and 6 show the embodiment of the bonding method of the conventional LOC-type package.
Figure 6:
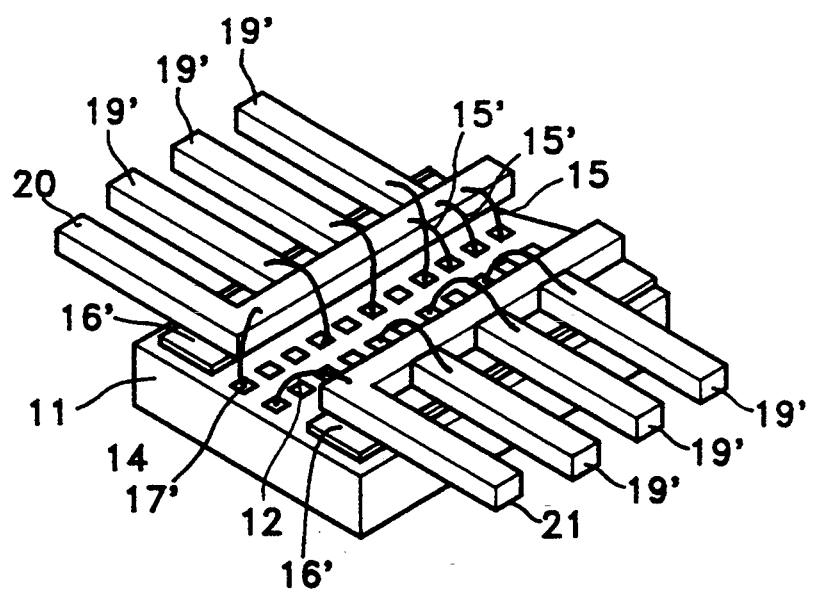
Figure 7:
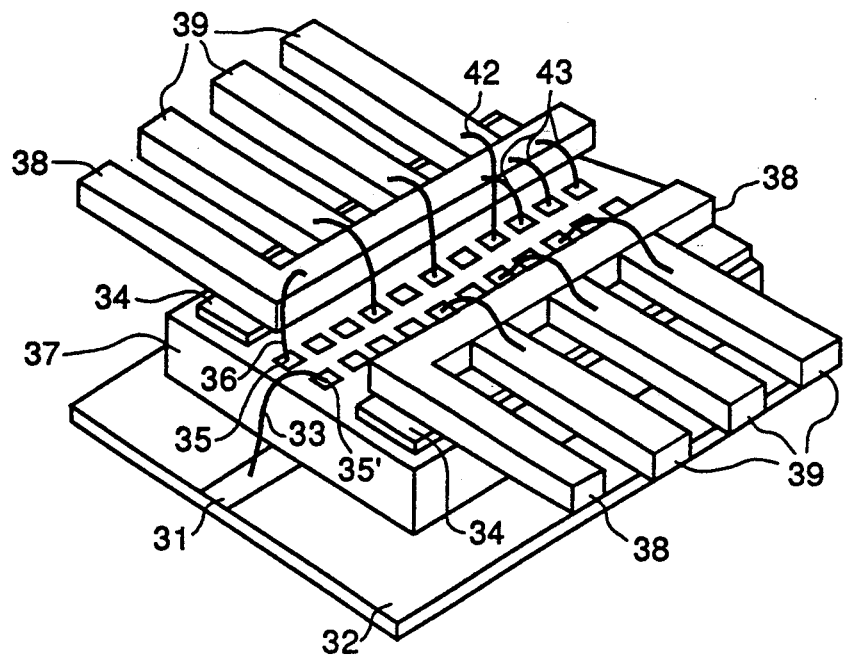
FIG. 7 shows the semiconductor device according to the bonding method of the present invention.

FIG. 7 shows the semiconductor device according to the bonding method of the present invention, and specifically shows the LOC-type semiconductor package.

Referring to FIG. 7, a plurality of bonding pads 35 are arranged in the lengthwise direction of a chip 37 on the center of the top surface of chip 37 separated from the semiconductor wafer after the sawing process is finished. A conductive member attached to the bottom surface of chip 37 and comprises an adhesive tape 32, for example, a conductive polyimide tape whose width is larger than that of the bottom surface of the chip, and an adhesive pad 31, i.e, a conductive layer extended lengthwise of the chip on the center of top surface of adhesive tape 32. An insulating tape 34 is extended in the lengthwise direction of chip 37 and attached to the right and left of bonding pads 35 on the chip's top surface. Leads 39, which is provided as an electrical connection with the chip, adheres chip 37 by insulating tape 34.

The extended region of the adhesive pad 31, i.e., a conductive layer adhered to the bottom surface of chip 37, and a specific pad 35' of chip 37 are connected to a first wire 33, i.e., a connecting member, and then are down-bonded.

Bonding pads 35 on the top surface of chip 37 are connected to leads 39 by a second wire 42, and connected to a power bus bar 38 by third wires 36 and 43.

As described above, the problem that the size of the conductive film and the region of bus-bar are not able to be extended when the conventional LOC-type package is down-bonded can be solved since the entire bottom surface of the chip can be used for down bonding.

Figure 8:
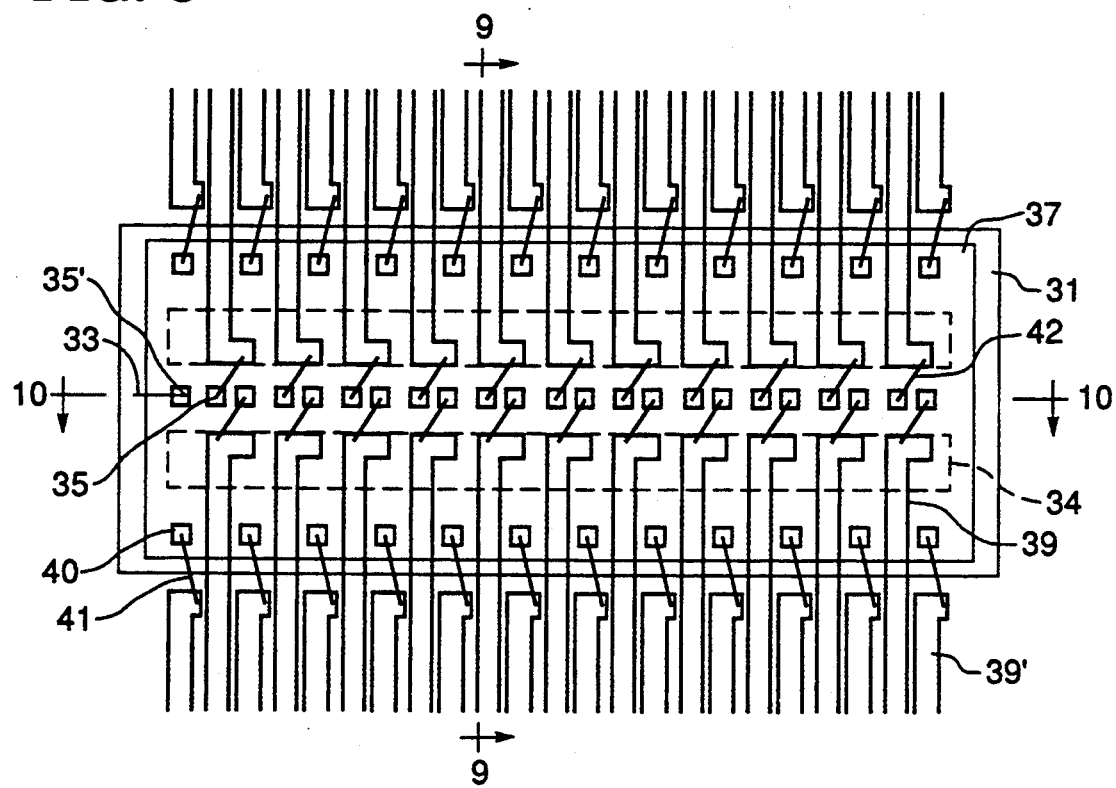
FIG. 8 shows the semiconductor device according to an embodiment of the present invention.

FIG.8 shows the semiconductor device wherein the mounting of a multi-pin is made possible according to an embodiment of the present invention, having a view of the inside of the semiconductor package from above.

As shown in FIG. 8, central bonding pads 35 are disposed lengthwise of chip 37 by a first predetermined spacing, on the center of the top surface of chip 37 wherein the adhesive pad (reference numeral 31 of FIG. 7), i.e., a conductive member, adhered to the bottom surface. Also, edge bonding pads 40 are disposed lengthwise of chip 37 by a second predetermined spacing, at the right and left edges of the top surface of chip 37.

A pair of insulating tape 34 is attached to the top surface of chip 37 between central bonding pad 35 line and edge bonding pad 40 line, in the lengthwise direction of chip 37.

The leads electrically connected to chip 37 are divided into two lead groups and disposed. A first lead group 39' is disposed by a third predetermined spacing, wherein one end is electrically connected to the external circuit and the other end comes close from the outside of the side of chip 37 to each edge bonding pad 40 and electrically connected to each edge bonding pad 40. A second lead group 39 is disposed between each lead of first lead group 39', wherein one end is electrically connected to the external circuit and the other end is extended to insulating tape 34 attached to the top surface of chip 37 and electrically connected to each central bonding pad 35. First and second lead groups 39' and 39 adhered to chip 37 by insulating tape 34.

Second lead group 39, i.e, a LOC-type lead, which is connected to the inside of the semiconductor package and disposed on the top surface of chip 37, is connected to, central bonding pads 35 by second wire 42, i.e., a connecting member. First lead group 39' which is disposed outside chip 37 is connected to edge bonding pads 40 by a fourth wire 41.

Also, specific pad 35' of chip 37 and the conductive adhesive pad 31, i.e., a conductive member adhered to the bottom surface of chip 37 are down-bonded by first wire 33. Conductive adhesive pad 31 is attached to the bottom surface of chip 37, and extends to the outside from one side of the chip wherein first and second lead group 39 and 39' are not disposed, and has a conductive layer on the part of the extended portion for down bonding.

According to an embodiment of the present invention, the multi-pin can be disposed smoothly by dividing the leads electrically connected to the chip into the center and right and left edges of the top surface of the chip. Further, the down bonding is possible using the conductive member adhered to the bottom surface of the chip.

Figure 9:
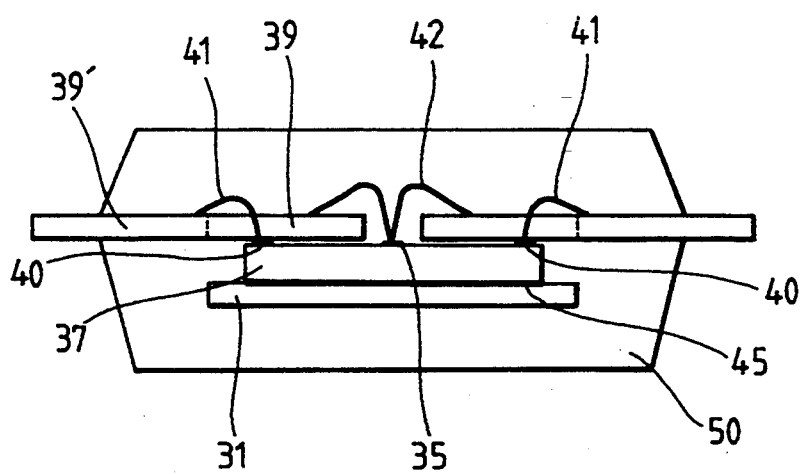
FIGS. 9 and 10 are the section views taken along A—A' and B-B' of FIG. 8, respectively.
Figure 10:
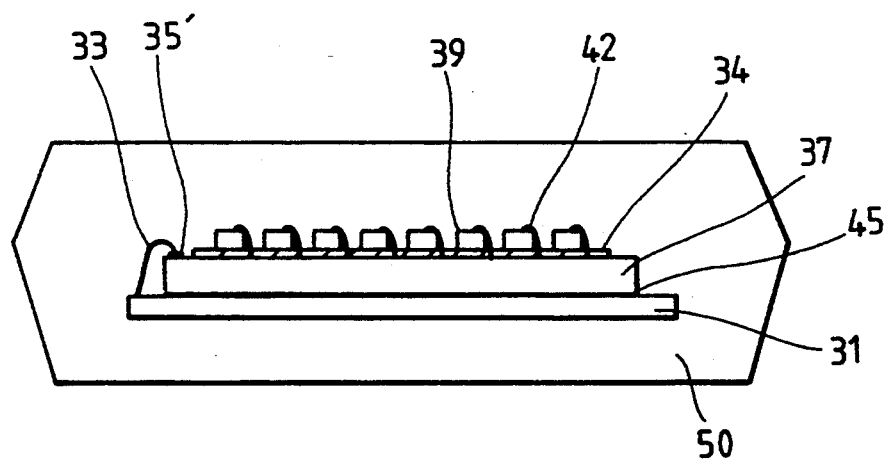

FIG. 9 and FIG. 10 are the section views taken along A-A' and B-B' of FIG. 8, respectively.

Referring to FIG. 9 and FIG. 10, central and edge bonding pads 35 and 40 are disposed on the center and the right and left edges of the top surface of chip 37 separated from the semiconductor wafer. Central bonding pad 35 is connected to second lead group 39, i.e., a LOC-type lead, by second wire 42, and the edge bonding pad 40 is connected to first lead group 39' disposed outside chip 37, by fourth wire 41. First and second lead group 39 and 39' adhered to chip 37 by insulating tape 34.

Conductive adhesive pad 31, i.e., a conductive member, adhered to the bottom surface of chip 37 by an adhesive 45, and specific pad 35' of chip 37 is down-bonded to conductive adhesive pad 31 by first wire 33.

Chip 37 and lead groups 39 and 39' wherein the wire bonding connection is completed, are encapsulated by a package mold 50. At this time, package mold 50 encapsulates as much as the area of lead groups 39 and 39', wherein one end electrically connected to the external circuit is excluded.

FIGS. 11A-11C and FIG. 12A-12C show the structure of the conductive member of the bottom surface of the chip used for the present invention.

Figure 11A:
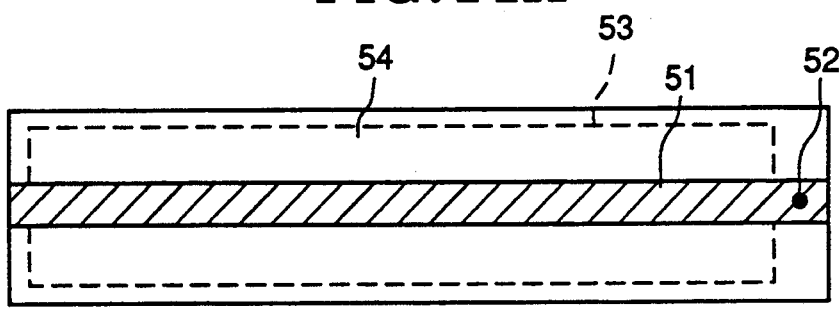
FIGS. 11A-11C and 12A-12C show the conductive member used for the present invention.
Figure 11B:
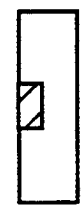
Figure 11C:

Referring to FIGS. 11A-C, a conductive metal is extended in a bar-shape on the center of an adhesive tape 54, for example, a conductive polyimide tape, as a conductive layer 51 so as to perform down bonding which supports the specific pad of a chip. A region 52 wherein the down bonding is performed is located at the end of conductive layer 51, i.e., a conductive metal, and a region 53 marked in dotted line indicates the region wherein the chip adhered to adhesive tape 54. The size of adhesive tape 54 is larger than that of the width of the bottom surface of chip 37, and conductive layer 51 extends in the lengthwise direction of chip 37. The conductive member of the present invention can comprise adhesive tape 54 of which size is larger than the width of the bottom surface of chip and the bar-shaped conductive layer which is extended lengthwise along the center of adhesive tape 54.

Figure 12A:
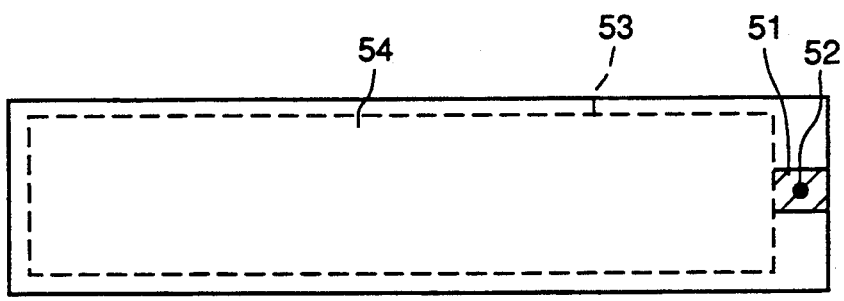
Figure 12B:
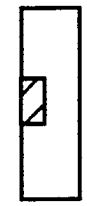
Figure 12C:
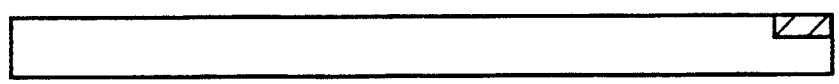

Referring to FIGS. 12A-12C, the bottom surface of chip adhered to the top surface of conductive adhesive tape 54, for example a conductive polyimide tape larger than the width of the bottom surface of chip. Also, conductive layer 51 for down bonding, for example a conductive metal, is formed on the part of the top surface of conductive adhesive tape 54 outside one side of chip 37. Region 52 to be down-bonded is located in the center of the conductive layer 51. The conductive member of the present invention can comprise the conductive adhesive tape larger than the width of the bottom surface of the chip and the conductive layer which is formed on the part of the top surface of the conductive adhesive tape extended outside one side of the chip.

Therefore, since the entire bottom surface of the chip wherein the conductive member adhered can be used for the down bonding according to the present invention, the down bonding is possible for the LOC-type package. Also, a mounting density can be increased since the multi-pin is made possible. Additionally, the balance of the thickness between the top and bottom mold of semiconductor package can be maintained to thereby improve an yield and ensure a highly reliable product.

The present invention enables more effective latch-up suppression, noise dispersion and speed improvement than the conventional LOC-type package structure.

It should be understood although preferred embodiments of the invention have been described in detail above, many modifications and variations could be effected therein by one with ordinary skill in the art without departing from the spirit and scope of the invention as defined by the appended claims.

What is claimed is:

1. A semiconductor device, comprising:
 a semiconductor chip having a top surface and a bottom surface, first and second longitudinal sides, and first and second lateral sides joining said first and second longitudinal sides;
 a lead-on-chip-type lead group including a plurality of leads electrically connected between said semiconductor chip and an external circuit;
 a plurality of electrical wires electrically connected between respective ones of said leads of said lead group and corresponding bonding pads provided on said top surface of said semiconductor chip along at least one of said first and second longitudinal sides of said chip;
 a member attached to said bottom surface of said semiconductor chip, said member having an extended portion extending outwardly of at least one of said first and second lateral sides of said semiconductor chip;

wherein said member includes a piece of adhesive tape having a width greater than that of said bottom surface of said semiconductor chip, to thereby provide said extended portion of said member, and a conductive layer provided on a top surface of said extended portion of said member; and, a down-bonding wire for down-bonding said conductive layer provided on said extended portion of said member and a corresponding bonding pad provided on said top surface of said semiconductor chip.

2. The semiconductor device as set forth in claim 1, wherein said piece of adhesive tape comprises conductive polyimide adhesive tape.

3. A semiconductor device, comprising:
a semiconductor chip having a top surface and a bottom surface, first and second longitudinal sides, and first and second lateral sides joining said first and second longitudinal sides;
a plurality of bonding pads disposed on a central portion of said top surface of said semiconductor chip parallel to said first and second longitudinal sides of said chip;
first and second strips of insulating tape attached to said top surface of said chip along said first and second longitudinal sides, respectively, on opposite sides of said bonding pads;
first and second lead groups, each of said lead groups including a plurality of parallel, spaced-apart leads having one end electrically connected to an external circuit and an opposite end attached to said first and second strips of insulating tape, respectively;
first and second power bus-bars attached to said first and second strips of insulating tape, respectively, in electrical contact with each of said leads of said first and second lead groups, respectively;
a member attached to said bottom surface of said semiconductor chip, said member having an extended portion extending outwardly of at least one of said first and second lateral sides of said semiconductor chip;
wherein said member includes a piece of adhesive tape having a width greater than that of said bottom surface of said semiconductor chip, to thereby provide said extended portion of said member, and a conductive layer provided on a top surface of said extended portion of said member;
a first plurality of electrical wires electrically connected between said leads of said first and second lead groups and respective ones of said bonding pads;
a second plurality of electrical wires electrically connected between said first and second power bus-bars and respective ones of said bonding pads; and,
a down-bonding wire for down-bonding said conductive layer provided on said extended portion of said member and a corresponding one of said bonding pads.

4. The semiconductor device as set forth in claim 3, further comprising a resin encapsulating the entirety of said semiconductor device except for end portions of said leads of said first and second lead groups including said opposite ends of said leads.

5. The semiconductor device as set forth in claim 3, wherein said piece of adhesive tape comprises conductive polyimide adhesive tape.

6. A semiconductor device, comprising:
a semiconductor chip having a top surface and a bottom surface, first and second longitudinal sides, and first and second lateral sides joining said first and second longitudinal sides;
a first group of spaced-apart bonding pads disposed on a central portion of said top surface of said chip parallel to said first and second longitudinal sides of said chip;
a second group of spaced-apart bonding pads disposed on a first marginal edge portion of said top surface of said chip adjacent and parallel to said first longitudinal sides of said chip;
a third group of spaced-apart bonding pads disposed on a second marginal edge portion of said top surface of said chip adjacent and parallel to said second longitudinal side of said chip;
a first strip of insulating tape attached to said top surface of said chip parallel to said first longitudinal side, between said first and second groups of bonding pads;
a second strip of insulating tape attached to said top surface of said chip parallel to said second longitudinal side, between said first and third groups of bonding pads;
a first lead group including a plurality of parallel, spaced-apart leads having one end electrically connected to an external circuit and an opposite end electrically connected to respective ones of said bonding pads of said second group of bonding pads;
a second lead group including a plurality of leads disposed between successive ones of said leads of said first lead group in parallel, spaced-apart relation thereto, said leads of said second lead group having one end electrically connected to an external circuit and an opposite end attached to said first strip of insulating tape and electrically connected to respective ones of said first group of bonding pads;
a third lead group including a plurality of parallel, spaced-apart leads having one end electrically connected to an external circuit and an opposite end electrically connected to respective ones of said bonding pads of said third group of bonding pads;
a fourth lead group including a plurality of leads disposed between successive ones of said leads of said third lead group in parallel, spaced-apart relation thereto, said leads of said fourth lead group having one end electrically connected to an external circuit and an opposite end attached to said second strip of insulating tape and electrically connected to respective ones of said first group of bonding pads;
a member attached to said bottom surface of said chip, said member having an extended portion extending outwardly of at least one of said first and second lateral sides of said semiconductor chip;
wherein said member includes a piece of adhesive tape having a surface area greater than that of said bottom surface of said chip, to thereby provide said extended portion of said member, and a conductive layer provided on a top surface of said extended portion of said member; and,
a down-bonding wire for down-bonding said conductive layer and a corresponding one of said bonding pads.

7. The semiconductor device as set forth in claim 6, further comprising a package body encapsulating the entirety of semiconductor device except for end portions of said leads of first, second, third, and fourth lead groups including said opposite ends of said leads.

8. The semiconductor device as set forth in claim 6, wherein said adhesive tape comprises conductive polyimide adhesive tape.

* * * * *